(12) United States Patent
Sato et al.

(10) Patent No.: US 9,040,322 B2
(45) Date of Patent: May 26, 2015

(54) METHOD FOR MANUFACTURING SEMICONDUCTOR LIGHT EMITTING ELEMENT

(75) Inventors: Taisuke Sato, Kanagawa-ken (JP); Kotaro Zaima, Tokyo (JP); Jumpei Tajima, Tokyo (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 13/601,231

(22) Filed: Aug. 31, 2012

(65) Prior Publication Data

US 2013/0244360 A1    Sep. 19, 2013

(30) Foreign Application Priority Data

Dec. 9, 2011   (JP) .................................. 2011-270709

(51) Int. Cl.
| | |
|---|---|
| *H01L 21/00* | (2006.01) |
| *H01L 33/12* | (2010.01) |
| *H01L 33/24* | (2010.01) |

(Continued)

(52) U.S. Cl.
CPC .............. *H01L 33/12* (2013.01); *H01L 33/24* (2013.01); *H01L 33/0075* (2013.01); *H01L 33/0079* (2013.01); *H01L 33/0095* (2013.01); *H01L 33/22* (2013.01)

(58) Field of Classification Search
CPC . H01L 33/0075; H01L 33/0079; H01L 33/22; H01L 33/24
USPC ................... 257/98, 99; 438/29, 42
See application file for complete search history.

(56) References Cited

U.S. PATENT DOCUMENTS

| | | | |
|---|---|---|---|
| 7,963,435 B2 * | 6/2011 | Sato et al. ...................... | 228/225 |
| 7,995,634 B2 * | 8/2011 | Kitano et al. ............ | 372/46.015 |
| 8,217,408 B2 * | 7/2012 | Matsuo .......................... | 257/95 |

(Continued)

FOREIGN PATENT DOCUMENTS

| | | |
|---|---|---|
| CN | 102117821 A | 7/2011 |
| JP | 2003-309286 | 10/2003 |

(Continued)

OTHER PUBLICATIONS

Korean Office Action issued Mar. 20, 2014, in Korean Patent Application No. 10-2014-0014675 (with English translation).

(Continued)

*Primary Examiner* — Nicholas Tobergte
(74) *Attorney, Agent, or Firm* — Oblon, McClelland, Maier & Neustadt, L.L.P.

(57) ABSTRACT

According to one embodiment, a method is disclosed for manufacturing a semiconductor light emitting element. The method can include bonding a stacked main body of a structural body to a substrate main body. The structural body includes a growth substrate and the stacked main body provided on the growth substrate. The stacked main body includes a first nitride semiconductor film, a light emitting film provided on the first nitride semiconductor film, and a second nitride semiconductor film provided on the light emitting film. The method can include removing the growth substrate. The method can include forming a plurality of stacked bodies. The method can include forming an uneven portion in a surface of a first nitride semiconductor layer. The method can include forming a plurality of the semiconductor light emitting elements.

19 Claims, 10 Drawing Sheets

(51) Int. Cl.
  *H01L 33/00*    (2010.01)
  *H01L 33/22*    (2010.01)

(56) References Cited

U.S. PATENT DOCUMENTS

| | | | |
|---|---|---|---|
| 8,258,533 B2* | 9/2012 | Seo et al. | 257/98 |
| 8,362,510 B2 | 1/2013 | Lee | |
| 8,395,179 B2* | 3/2013 | Muramoto | 257/99 |
| 8,686,454 B2* | 4/2014 | Choi et al. | 257/98 |
| 2009/0186215 A1 | 7/2009 | Sato et al. | |

FOREIGN PATENT DOCUMENTS

| | | |
|---|---|---|
| JP | 2004-193338 | 7/2004 |
| JP | 2006-310688 | 11/2006 |
| JP | 2009-283512 | 12/2009 |
| JP | 2010-251390 | 11/2010 |
| JP | 2011-61036 | 3/2011 |
| JP | 2011-91241 | 5/2011 |
| JP | 2011-171741 | 9/2011 |
| JP | 2011-187873 A | 9/2011 |
| KR | 10-2007-0042214 A | 4/2007 |
| KR | 10-0975659 B1 | 8/2010 |

OTHER PUBLICATIONS

U.S. Appl. No. 14/083,927, filed Nov. 19, 2013, Tajima, et al.
U.S. Appl. No. 13/780,678, filed Feb. 28, 2013, Yamada, et al.
Office Action issued Dec. 10, 2013 in Korean Patent Application No. 10-2012-0140727 (with English language translation).
U.S. Appl. No. 13/222,238, filed Aug. 31, 2011, Taisuke Sato, et al.
Office Action issued Jun. 29, 2012 in Japanese Application No. 2011-270709 (With English Translation).
Japanese Office Action issued Jan. 5, 2015, in Japan Patent Application No. 2012-182764 (with English translation).
Chinese Office Action issued Jan. 23, 2015, in corresponding Chinese Patent Application No. 201210525705.6 (with English-language Translation).

* cited by examiner

US 9,040,322 B2

METHOD FOR MANUFACTURING SEMICONDUCTOR LIGHT EMITTING ELEMENT

CROSS-REFERENCE TO RELATED APPLICATIONS

This application is based upon and claims the benefit of priority from the prior Japanese Patent Application No. 2011-270709, filed on Dec. 9, 2011; the entire contents of which are incorporated herein by reference.

FIELD

Embodiments described herein relate generally to a method for manufacturing semiconductor light emitting element.

BACKGROUND

Semiconductor light emitting elements such as light emitting diodes, etc., are widespread. It is desirable to increase the yield of methods for manufacturing semiconductor light emitting elements.

DETAILED DESCRIPTION

Figure 1:
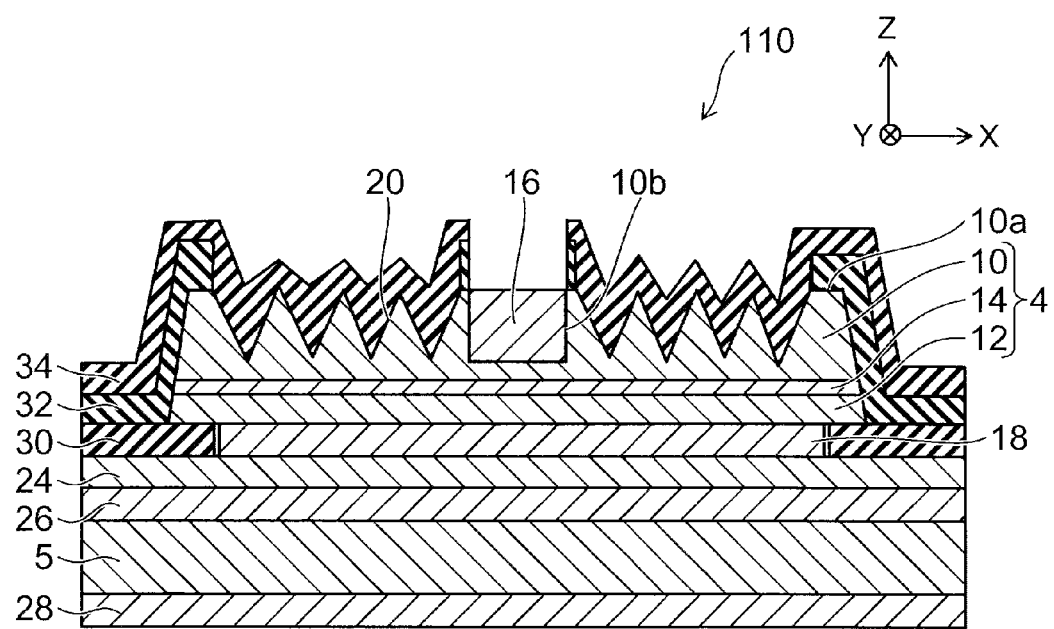
FIG. 1 is a schematic cross-sectional view illustrating the configuration of a semiconductor light emitting element according to an embodiment.

According to one embodiment, a method is disclosed for manufacturing a semiconductor light emitting element. The method can include bonding a stacked main body to a substrate main body. The stacked main body is included in a structural body. The structural body further includes a growth substrate. The stacked main body is provided on the growth substrate. The stacked main body includes a first nitride semiconductor film of a first conductivity type, a light emitting film provided on the first nitride semiconductor film, and a second nitride semiconductor film of a second conductivity type provided on the light emitting film. A tensile stress is applied to the stacked main body. The method can include removing the growth substrate. The method can include forming a plurality of stacked bodies by dividing the stacked main body into a plurality of regions by removing a portion of the stacked main body. The stacked bodies include a first nitride semiconductor layer formed from the first nitride semiconductor film, a second nitride semiconductor layer formed from the second nitride semiconductor film, and a light emitting layer formed from the light emitting film. The method can include forming an uneven portion in a surface of the first nitride semiconductor layer on a side opposite to the light emitting layer for each of the stacked bodies. The method can include forming a plurality of the semiconductor light emitting elements by dividing the substrate main body for each of the stacked bodies. Each of the semiconductor light emitting elements includes the stacked body and a supporting substrate formed from the divided substrate main body.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

FIG. 1 is a schematic cross-sectional view illustrating the configuration of a semiconductor light emitting element according to an embodiment.

As illustrated in FIG. 1, the semiconductor light emitting element 110 according to this embodiment includes a stacked body 4 and a supporting substrate 5.

The stacked body 4 includes a first nitride semiconductor layer 10, a second nitride semiconductor layer 12, and a light emitting layer 14. For example, the first nitride semiconductor layer 10, the second nitride semiconductor layer 12, and the light emitting layer 14 are formed on a substrate other than the supporting substrate 5. For example, the stacked body 4 is bonded to the supporting substrate 5 after being formed on the other substrate.

The first nitride semiconductor layer 10 has a first conductivity type. The second nitride semiconductor layer 12 has a second conductivity type. The second conductivity type is different from the first conductivity type. For example, the first conductivity type is an n type; and the second conductivity type is a p type. The embodiment is not limited thereto. The first conductivity type may be the p type; and the second conductivity type may be the n type. Hereinbelow, the case is described where the first conductivity type is the n type and the second conductivity type is the p type.

The first nitride semiconductor layer 10 may include, for example, an n-type GaN layer. The second nitride semiconductor layer 12 may include, for example, a p-type GaN layer.

An uneven portion 20 is provided in a surface 10a of the first nitride semiconductor layer 10 on the side opposite to the light emitting layer 14. The uneven portion 20 suppresses the total internal reflection of light emitted by the light emitting layer 14 at the surface 10a of the first nitride semiconductor layer 10. Thereby, the light extraction efficiency improves.

The light emitting layer 14 is provided between the first nitride semiconductor layer 10 and the second nitride semiconductor layer 12. One surface of the light emitting layer 14 contacts the first nitride semiconductor layer 10. The other surface of the light emitting layer 14 contacts the second nitride semiconductor layer 12. The light emitting layer 14 may include, for example, a stacked film of InAlGaN and InGaN.

Herein, a direction from the second nitride semiconductor layer 12 toward the first nitride semiconductor layer 10 is taken as a Z-axis direction. One axis perpendicular to the Z axis is taken as an X axis. One axis perpendicular to the Z axis and the X axis is taken as a Y axis. The Z-axis direction corresponds to the stacking direction of the first nitride semiconductor layer 10, the light emitting layer 14, and the second nitride semiconductor layer 12. In the specification of the application, "stacking" includes not only the case of being directly overlaid but also the case of being overlaid with another component inserted therebetween. Being "provided on" includes not only the case of being disposed directly in contact but also the case of being disposed with another component inserted therebetween. "Bonding" includes not only the state of being directly fixed but also the state of being fixed in a state in which another component is inserted therebetween.

The semiconductor light emitting element 110 further includes a first electrode 16, a second electrode (the electrode) 18, a first bonding layer 24, a second bonding layer 26, a back surface electrode 28, a first insulating layer 30, a second insulating layer 32, and a third insulating layer 34.

The first electrode 16 is provided on the surface 10a of the first nitride semiconductor layer 10 and is electrically connected to the first nitride semiconductor layer 10. The second electrode 18 is provided on the surface of the second nitride semiconductor layer 12 on the side opposite to the light emitting layer 14 and is electrically connected to the second nitride semiconductor layer 12.

The second bonding layer 26 is provided on the supporting substrate 5. The first bonding layer 24 is provided on the second bonding layer 26. The second electrode 18 is provided on the first bonding layer 24. The first bonding layer 24 and the second bonding layer 26 are used to bond the supporting substrate 5 to the stacked body 4 which is formed on the other substrate.

The supporting substrate 5 supports the stacked body 4 via the first bonding layer 24 and the second bonding layer 26. The supporting substrate 5 may include, for example, a semiconductor material that is conductive. The back surface electrode 28 is provided on the surface of the supporting substrate 5 on the side opposite to the second bonding layer 26. The back surface electrode 28 is electrically connected to the second electrode 18 via the first bonding layer 24, the second bonding layer 26, and the supporting substrate 5. The back surface electrode 28 is used to electrically connect the semiconductor light emitting element 110 to an external device.

The first insulating layer 30 is provided on a portion of the first bonding layer 26 other than that of the second electrode 18. The thickness of the first insulating layer 30 (the length along the Z-axis direction) is substantially the same as the thickness of the second electrode 18. The first insulating layer 30 reduces the difference in levels caused by the second electrode 18. Herein, the thickness of the first insulating layer 30 being substantially the same as the thickness of the second electrode 18 refers to, for example, the difference between the thickness of the second electrode 18 and the thickness of the first insulating layer 30 being ±10 nm. Or, this refers to the thickness of the first insulating film 30 being not less than 90% and not more than 110% of the thickness of the second electrode 18.

The second insulating layer 32 is provided on a portion of the first insulating layer 30 and on a portion of the first nitride semiconductor layer 10. The second insulating layer 32 may be used as a mask when forming the uneven portion 20 in the first nitride semiconductor layer 10. The third insulating layer 34 is provided on a portion of the second insulating layer 32 and on a portion of the first nitride semiconductor layer 10. The third insulating layer 34 may be used as a mask when a recess 10b for forming the first electrode 16 is made in the first nitride semiconductor layer 10.

Figure 2:
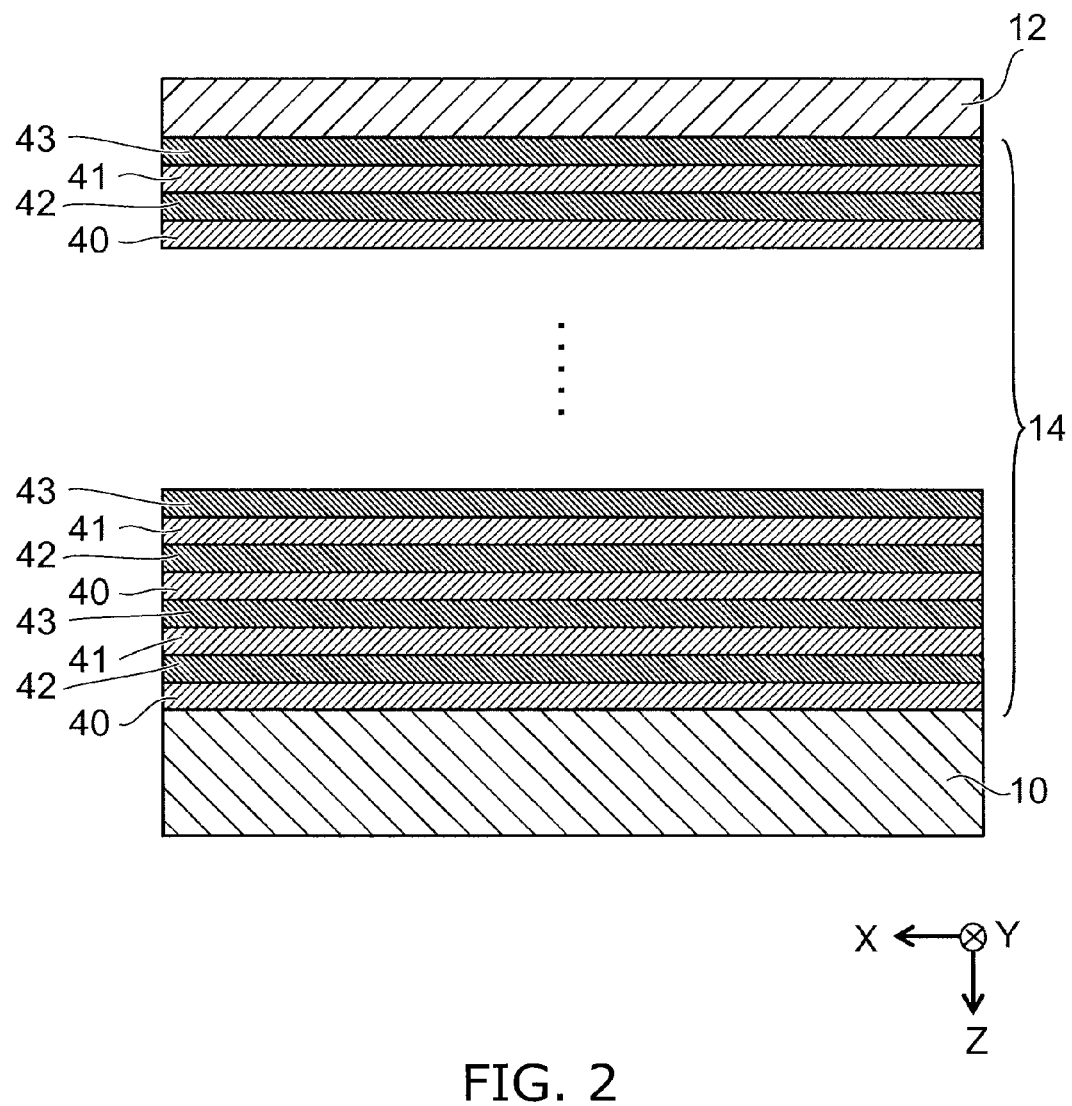
FIG. 2 is a schematic cross-sectional view illustrating the configuration of the light emitting unit according to the embodiment.

FIG. 2 is a schematic cross-sectional view illustrating the configuration of the light emitting unit according to the embodiment.

In FIG. 2, the Z-axis direction is inverted with respect to the Z-axis direction of FIG. 1.

As illustrated in FIG. 2, the light emitting layer 14 includes multiple barrier layers 40 and well layers 41 provided between the multiple barrier layers 40. The multiple barrier layers 40 and the multiple well layers 41 are alternately stacked. In this example, intermediate layers (an n-side intermediate layer 42 and a p-side intermediate layer 43) are provided respectively in the spaces between the barrier layers 40 and the well layers 41.

For example, the barrier layer 40 is provided on the first nitride semiconductor layer 10. The n-side intermediate layer 42 is provided on the barrier layer 40. The well layer 41 is provided on the n-side intermediate layer 42. The p-side intermediate layer 43 is provided on the well layer 41. The barrier layer 40, the n-side intermediate layer 42, the well layer 41, and the p-side intermediate layer 43 form one set (one period). Multiple sets are stacked. In other words, the light emitting layer 14 may have a multiple quantum well (MQW) structure.

The light emitting layer 14 may have a single quantum well (SQW) structure. In such a case, one of the sets recited above is used; and the number of the well layers 41 is 1.

At least one selected from the n-side intermediate layer 42 and the p-side intermediate layer 43 may be provided if necessary and may be omitted.

The barrier layer 40 may include, for example, $In_{x1}Al_{y1}Ga_{1-x1-y1}N$ ($0 < x1 < 1$ and $0 < y1 < 1$). The barrier layer 40 may include, for example, $In_{0.02}Al_{0.33}Ga_{0.65}N$. For example, the thickness of the barrier layer 40 is 11.5 nanometers (nm).

The n-side intermediate layer 42 may include, for example, $In_{x2}Ga_{1-x2}N$ ($0 < x2 < 1$). The n-side intermediate layer 42 may include, for example, $In_{0.02}Ga_{0.98}N$. For example, the thickness of the n-side intermediate layer 42 is 0.5 nm.

The well layer 41 may include, for example, $In_{x3}Ga_{1-x3}N$ ($0 < x3 < 1$). The well layer 41 may include, for example, $In_{0.15}Ga_{0.85}N$. For example, the thickness of the well layer 41 is 2.5 nm.

The p-side intermediate layer 43 may include, for example, $In_{x4}Ga_{1-x4}N$ ($0 < x4 < 1$). The p-side intermediate layer 43 may include, for example, $In_{0.02}Ga_{0.98}N$. For example, the thickness of the p-side intermediate layer 43 is 0.5 nm.

In the embodiment, at least one selected from the material and the thickness of the barrier layer 40 may be different between the multiple barrier layers 40. In the case where the multiple well layers 41 are provided, at least one selected from the material and the thickness of the well layer 41 may be different between the multiple well layers 41. In the case where the multiple n-side intermediate layers 42 are provided, at least one selected from the material and the thickness of the n-side intermediate layer 42 may be different between the multiple n-side intermediate layers 42. In the case where the multiple p-side intermediate layers 43 are provided, at least one selected from the material and the thickness of the p-side intermediate layer 43 may be different between the multiple p-side intermediate layers 43.

An example of a method for manufacturing the semiconductor light emitting element 110 will now be described.

FIG. 3A to FIG. 3D, FIG. 4A to FIG. 4D, FIG. 5A to FIG. 5D, and FIG. 6A to FIG. 6D are schematic cross-sectional views illustrating the method for manufacturing the semiconductor light emitting element according to the embodiment.

Figure 3A:
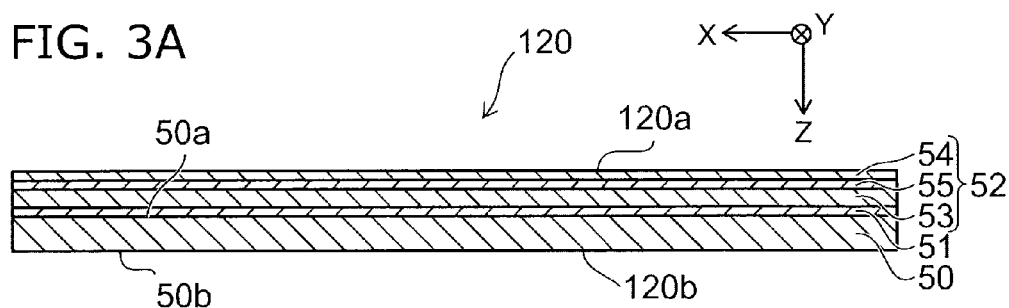
FIG. 3A to FIG. 3D are schematic cross-sectional views illustrating the method for manufacturing the semiconductor light emitting element according to the embodiment.

When the semiconductor light emitting element 110 is manufactured as illustrated in FIG. 3A, first, a buffer layer 51 is formed on a growth substrate 50. The growth substrate 50 includes a first surface 50a and a second surface 50b on the side opposite to the first surface 50a. The buffer layer 51 is formed on the first surface 50a. The growth substrate 50 may include, for example, a Si substrate. For example, multiple semiconductor light emitting elements 110 are manufactured simultaneously on the growth substrate 50. In FIG. 3A to FIG. 6D, two portions that are used to form the semiconductor light emitting elements 110 are arranged in the X-axis direction.

The buffer layer 51 may include, for example, $In_{x5}Al_{y5}Ga_{1-x5-y5}N$ ($0 \leq x5 < 1$ and $0 \leq y5 < 1$). The buffer layer 51 may include, for example, AlN. For example, the thickness of the buffer layer 51 is 100 nm.

Figure 7:
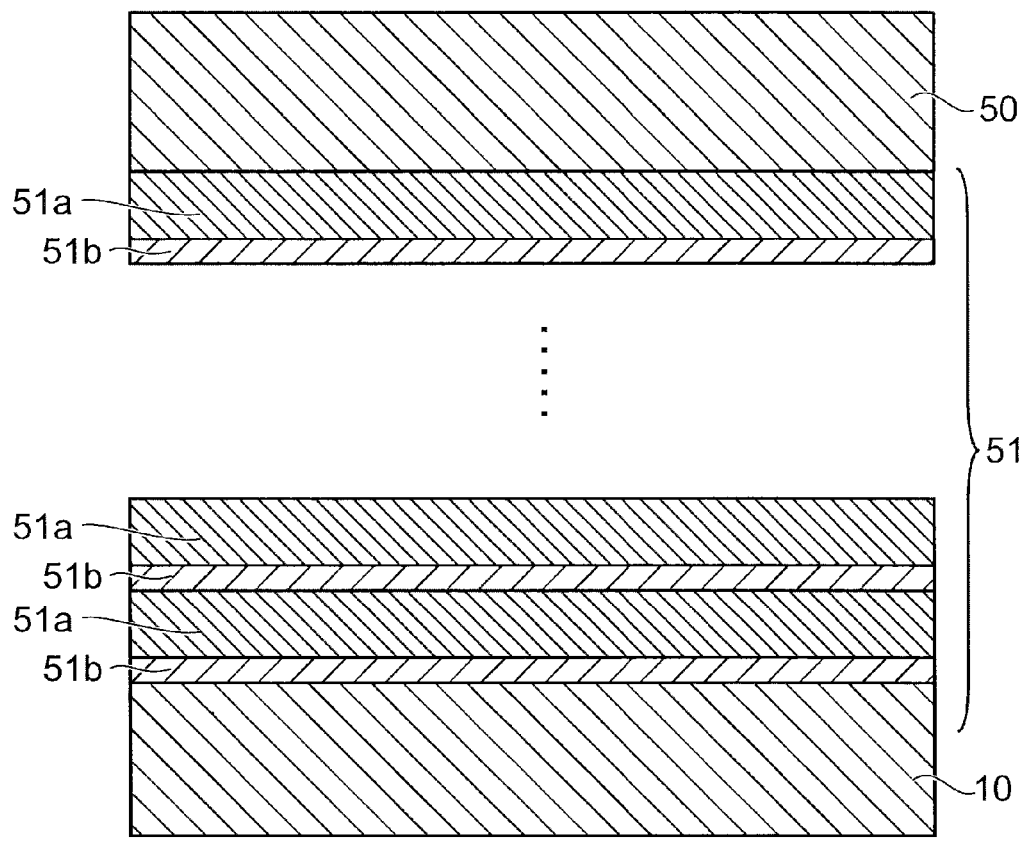
FIG. 7 is a schematic cross-sectional view illustrating the configuration of the buffer layer according to the embodiment.
Figure 7:
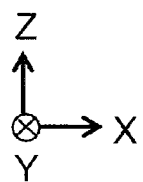

FIG. 7 is a schematic cross-sectional view illustrating the configuration of the buffer layer according to the embodiment.

As illustrated in FIG. 7, there are cases where the buffer layer 51 includes multiple stacked structures of multiple first buffer layers 51a and multiple second buffer layers 51b.

The first buffer layer 51a may include, for example, $In_{x6}Al_{y6}Ga_{1-x6-y6}N$ ($0 \leq x6 < 1$ and $0 \leq y6 < 1$). The first buffer layer 51a may include, for example, AlN. For example, the thickness of the first buffer layer 51a is 10 nm.

The second buffer layer 51b may include, for example, $In_{x7}Al_{y7}Ga_{1-x7-y7}N$ ($0 \leq x7 < 1$ and $0 \leq y7 < 1$). The second buffer layer 51b may include, for example, $Al_{0.75}Ga_{0.25}N$. For example, the thickness of the second buffer layer 51b is 50 nm.

As illustrated in FIG. 3A, a stacked main body 52 is formed on the buffer layer 51 after forming the buffer layer 51. The stacked main body 52 includes a first nitride semiconductor film 53 that is used to form the first nitride semiconductor layer 10, a second nitride semiconductor film 54 that is used to form the second nitride semiconductor layer 12, and a light emitting film 55 that is used to form the light emitting layer 14. The light emitting film 55 is provided between the first nitride semiconductor film 53 and the second nitride semiconductor film 54. For example, metal organic chemical vapor deposition (MOCVD) is used to form the stacked main body 52.

Thereby, a structural body 120 that includes the growth substrate 50 and the stacked main body 52 is formed. The structural body 120 includes the buffer layer 51 between the growth substrate 50 and the first nitride semiconductor film 53. To form the structural body 120, for example, the buffer layer 51 is formed on the first surface 50a of the growth substrate 50; the first nitride semiconductor film 53 is formed on the buffer layer 51; the light emitting film 55 is formed on the first nitride semiconductor film 53; and the second nitride semiconductor film 54 is formed on the light emitting film 55. For example, in the case where the buffer layer 51 is not provided, the first nitride semiconductor film 53 is formed on the first surface 50a of the growth substrate 50. The structural body 120 has a first major surface 120a on the stacked main body 52 side and a second major surface 120b on the growth substrate 50 side.

Figure 8:
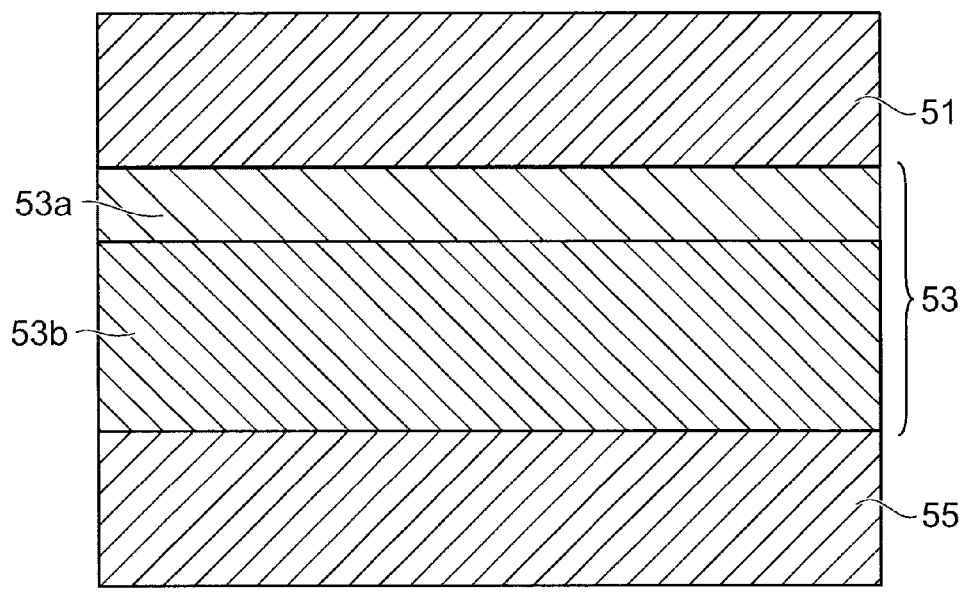
FIG. 8 is a schematic cross-sectional view illustrating the configuration of the first nitride semiconductor film according to the embodiment.

FIG. 8 is a schematic cross-sectional view illustrating the configuration of the first nitride semiconductor film according to the embodiment.

As illustrated in FIG. 8, there are cases where the first nitride semiconductor film 53 has a stacked structure including a first GaN layer 53a (a first layer) to which an impurity is not added, and a second GaN layer 53b (a second layer) to which Si is added. The forming of the first nitride semiconductor film 53 includes forming the first GaN layer 53a on the buffer layer 51 and forming the second GaN layer 53b on the first GaN layer 53a. The concentration of the impurity of the second GaN layer 53b which includes Si is higher than the concentration of the impurity of the first GaN layer 53a.

When the stacked main body 52 which includes the nitride semiconductor is formed on the growth substrate 50 which is the Si substrate, a large tensile stress is applied to the stacked main body 52. For example, the tensile stress is applied to the stacked main body 52 due to the difference between the coefficients of thermal expansion of the growth substrate 50 and the stacked main body 52 when cooling after the stacked main body 52 is grown. The tensile stress that is applied when cooling remains in the interior of the stacked main body 52. Thus, the tensile stress is applied to the stacked main body 52.

Figure 3B:
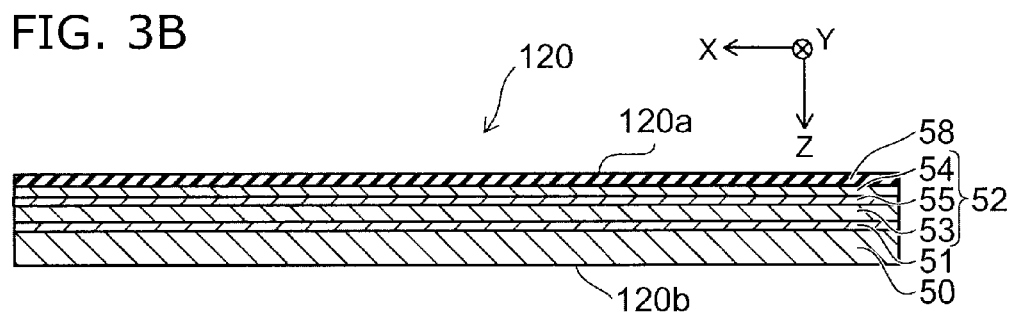

As illustrated in FIG. 3B, a first insulating film (an etching stop film) 58 that is used to form the first insulating layer 30 is formed on the stacked main body 52. The first insulating film 58 may include, for example, an oxide film of at least one selected from Si, Al, Ti, Zr, In, Sn, and Ni, a nitride film of the at least one, or an oxynitride film of the at least one. The first insulating film 58 may include, for example, a $SiO_2$ film. The first insulating film 58 may include, for example, a metal material including at least one element selected from the group consisting of Ni, Pt, W, Au, Ti, and Al. For example, thermal CVD is used to form the first insulating film 58.

Figure 3C:
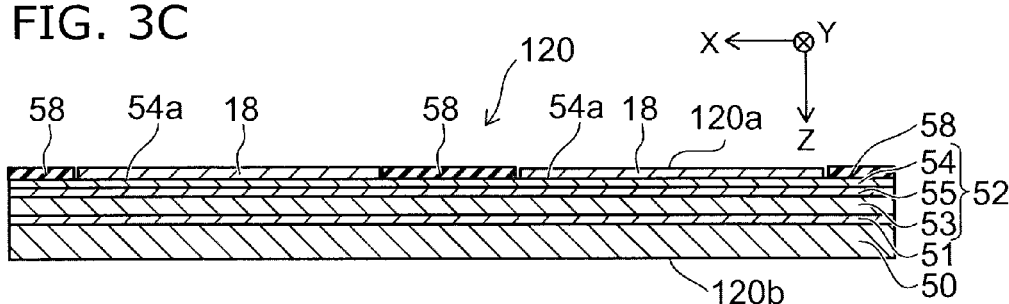

For example, as illustrated in FIG. 3C, a portion 54a of the second nitride semiconductor film 54 is exposed by removing a portion of the first insulating film 58 by photolithography and etching. Subsequently, the second electrode 18 is formed on the portion 54a of the second nitride semiconductor film 54. The second electrode 18 is formed to have substantially the same thickness as the first insulating film 58. For example, vapor deposition is used to form the second electrode 18. For example, the second electrode 18 is a metal film including at least one element selected from Ni, Pt, Ag, Ti, Al, In, and Au.

Figure 3D:
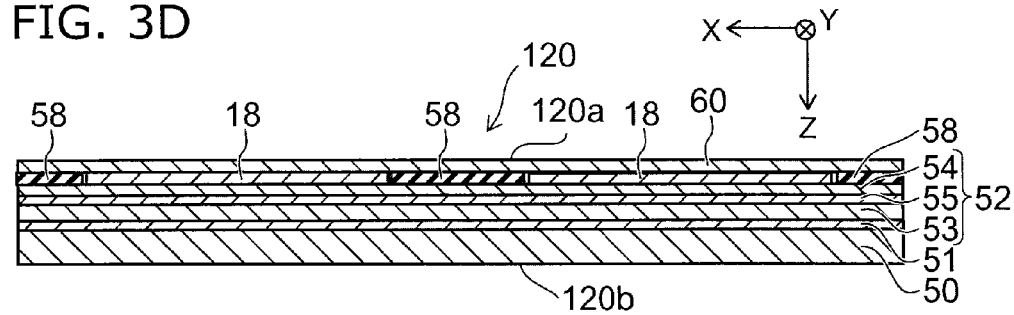

As illustrated in FIG. 3D, a first bonding film 60 that is used to form the first bonding layer 24 is formed on the first insulating film 58 and the second electrode 18. In other words, the first bonding film 60 is formed on the stacked main body 52. For example, the first bonding film 60 is a metal film including at least one element selected from Pt, Ti, Al, Ni, W, and Au. The first bonding film 60 may include, for example, a stacked film in which a Ti film, a Pt film, and a Au film are stacked in this order.

Figure 4A:
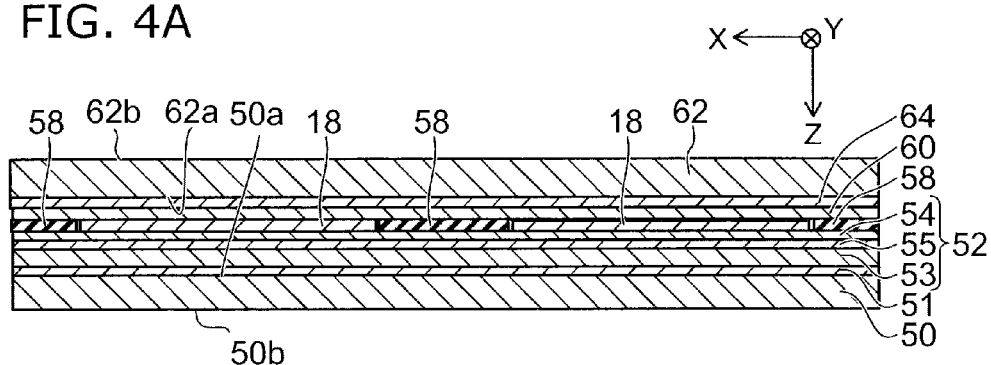
FIG. 4A to FIG. 4D are schematic cross-sectional views illustrating the method for manufacturing the semiconductor light emitting element according to the embodiment.

As illustrated in FIG. 4A, a substrate main body 62 that is used to form the supporting substrate 5 of FIG. 1 is prepared. The substrate main body 62 has a third surface 62 (a bonding surface) and a fourth surface 62b (a back surface) on the side opposite to the third surface. A second bonding film 64 that is used to form the second bonding layer 26 is formed on the third surface 62a of the substrate main body 62. The substrate main body 62 may include, for example, a Si substrate. The second bonding film 64 may include, for example, a Au—Sn film. After forming the second bonding film 64 on the substrate main body 62, the first major surface 120*a* of the structural body 120 on the stacked main body 52 side is bonded to the substrate main body 62. The stacked main body 52 is bonded to the substrate main body 62. Namely, the structural body 120 is bonded to the substrate main body 62 with the first surface 50*a* and the third surface 62*a* facing each other.

When bonding the first major surface 120*a* to the substrate main body 62, the substrate main body 62 is disposed on the structural body 120 with the first bonding film 60 and the second bonding film 64 contacting each other. Subsequently, pressure is applied to the structural body 120 and the substrate main body 62 for a constant amount of time at a high temperature. For example, a pressure of 1 kN is applied for 5 minutes at 280° C. Thereby, the first bonding film 60 and the second bonding film 64 are bonded to each other; and the structural body 120 and the substrate main body 62 become a single body. At this time, the bonding surface between the first bonding film 60 and the second bonding film 64 is flat because the second electrode 18 and the first insulating film 58 are formed with substantially the same thickness. Thereby, the bondability between the first bonding film 60 and the second bonding film 64 can be improved.

After the structural body 120 is bonded to the substrate main body 62, the thickness of the growth substrate 50 is reduced by polishing the growth substrate 50. The growth substrate 50 is polished to cause the thickness of the growth substrate 50 to be, for example, not less than 5 μm and not more than 50 μm. For example, by the thickness of the growth substrate 50 being not more than 50 μm, the growth substrate 50 is easy to remove in the process of removing the growth substrate 50 which is performed subsequently. For example, by the thickness of the growth substrate 50 being not less than 5 μm, physical damage of the stacked main body 52, etc., that undesirably occurs due to the polishing can be suppressed.

Figure 4B:
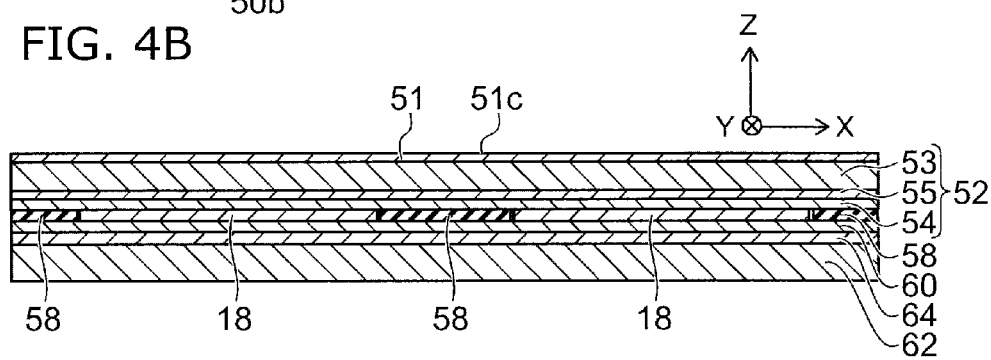

As illustrated in FIG. 4B, the growth substrate 50 is removed by performing etching with the growth substrate 50 facing upward. For example, etching by a fluoric reactant gas is used to etch the growth substrate 50. The buffer layer 51 is used as a stopper in the etching of the growth substrate 50. In particular, the first buffer layer 51*a* (the AlN layer) included in the buffer layer 51 is used as the stopper. For example, the thickness of the AlN layer is not less than 100 μm. As a result, a sufficiently good function for the etching stopper can be obtained in the whole surface of the wafer. Thereby, a surface 51*c* of the buffer layer 51 on the growth substrate 50 side is exposed.

The fluoric reactant gas which is the etching gas may include, for example, $C_4F_8$, $SF_6$, etc. Thereby, the etching rate ratio of the growth substrate 50, which includes Si, and the AlN layer of the buffer layer 51 can be 100 times or more. In the case where the etching rate ratio of the growth substrate 50 and the buffer layer 51 is low, there is a risk that effects of the etching may reach the proximity of the light emitting film 55 according to the state of the unevenness of the surface 50*a* of the growth substrate 50 on the side opposite to the buffer layer 51, etc., to undesirably cause the characteristics of the semiconductor light emitting element 110 to degrade. Conversely, if the etching rate ratio of the growth substrate 50 and the buffer layer 51 is not less than 100 times, the effects of the etching on the stacked main body 52 can be suppressed by the buffer layer 51.

Figure 4C:
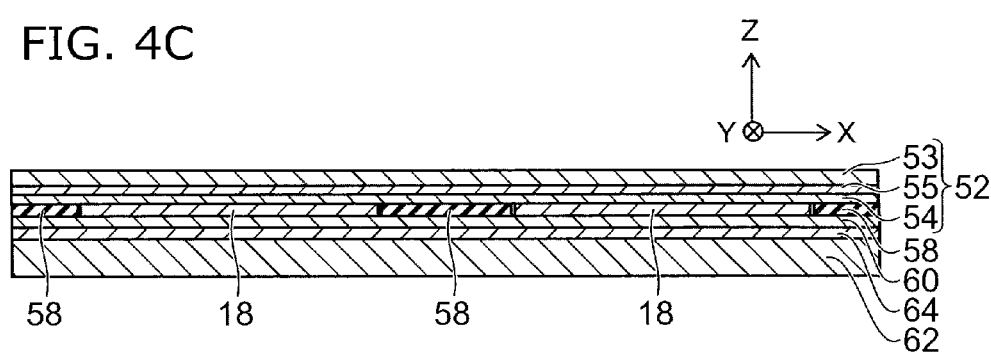

As illustrated in FIG. 4C, the buffer layer 51 and a portion of the first nitride semiconductor film 53 are removed by performing etching by a chlorine-based reactant gas. A chlorine-based gas such as $Cl_2$, $BCl_3$, etc., is used as the etching gas to etch the buffer layer 51. Also, physical etching can be added by mixing Ar gas into the chlorine-based gas. Thereby, it becomes easier to control the etching depth because the etching rate ratio of the buffer layer 51 and the first nitride semiconductor film 53 decreases. For example, the portion of the first nitride semiconductor film 53 is the first GaN layer 53*a* provided on the buffer layer 51 side.

Figure 4D:
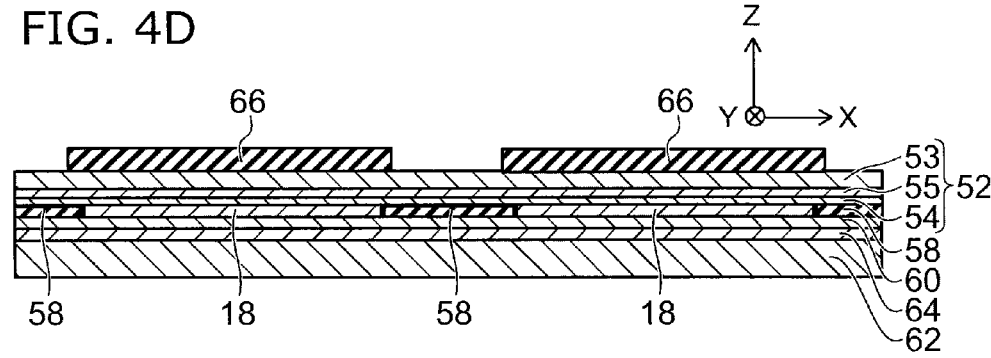

For example, as illustrated in FIG. 4D, an insulating film 66 is formed on the stacked main body 52 by lithography and etching. The insulating film 66 is formed on the portion opposing the second electrode 18 to correspond to the configuration of the first nitride semiconductor layer 10, the second nitride semiconductor layer 12, and the light emitting layer 14. The insulating film 66 may include, for example, $SiO_2$.

Figure 5A:
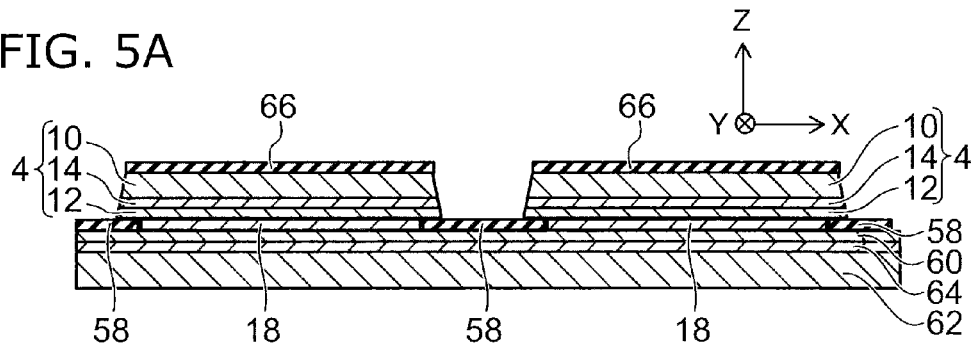
FIG. 5A to FIG. 5D are schematic cross-sectional views illustrating the method for manufacturing the semiconductor light emitting element according to the embodiment.

As illustrated in FIG. 5A, the stacked main body 52 is divided into multiple regions by removing a portion of the stacked main body 52. When the stacked main body 52 is divided, the first nitride semiconductor layer 10 is formed from the first nitride semiconductor film 53; the second nitride semiconductor layer 12 is formed from the second nitride semiconductor film 54; and the light emitting layer 14 is formed from the light emitting film 55. Thereby, the multiple stacked bodies 4 are formed from the stacked main body 52. For example, the removal of the stacked main body 52 is performed by dry etching using the insulating film 66 as a mask. For example, when removing the stacked main body 52, the stacked main body 52 is divided by etching the stacked main body 52 from the first nitride semiconductor film 53 side to the first insulating film 58 using the first insulating film 58 as an etching stop film.

The tensile stress remaining in the stacked main body 52 can be reduced by dividing the stacked main body 52. For example, a sample having the same structure as that of FIG. 4C is constructed by forming the stacked main body 52 on a three-inch Si substrate. The thickness of the substrate main body 62 is 380 μm. In such a case, the stacked main body 52 warps in a bowl-like configuration (a state in which the central portion protrudes downward) with a curvature having a curvature radius of 4.5 m in the state in which the stacked main body 52 faces upward. In this state, a tensile stress of 1.96 GPa remains in the stacked main body 52. The stacked bodies 4 are formed in this sample by dividing the stacked main body 52 by performing dry etching. At this time, the warp of the sample is relaxed to a curvature radius of 5.0 m. The tensile stress decreases to 1.73 GPa.

Figure 5B:
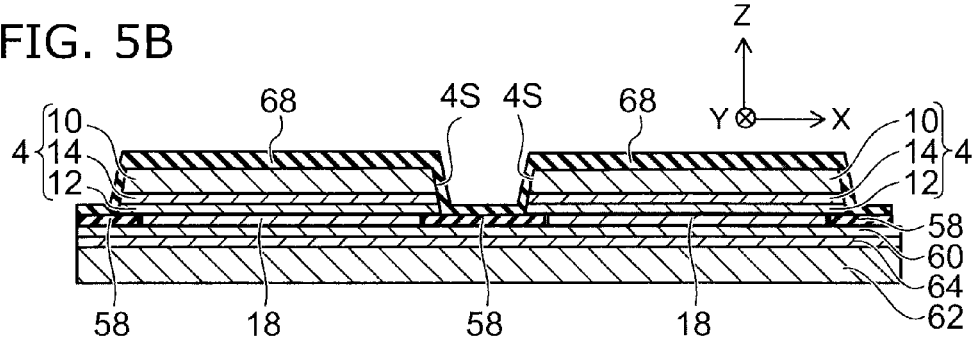

As illustrated in FIG. 5B, a second insulating film 68 that is used to form the second insulating layer 32 is formed on the first nitride semiconductor layer 10 and the first insulating film 58. The second insulating film 68 may include, for example, $SiO_2$. Thereby, the insulating film 66 and the second insulating film 68 become a single body. The second insulating film 68 covers a side surface 4*s* of the stacked body 4.

Figure 5C:
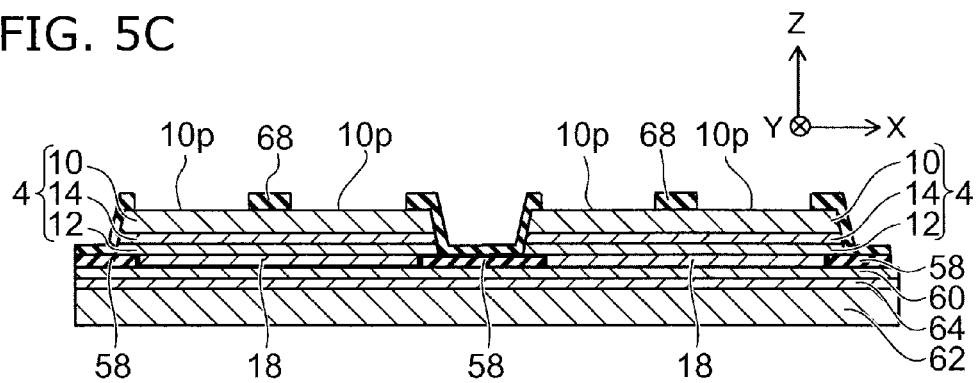

As illustrated in FIG. 5C, a portion 10*p* of the first nitride semiconductor layer 10 is exposed by removing a portion of the second insulating film 68. For example, the removal of the second insulating film 68 is performed by using lithography to pattern a photoresist on the second insulating film 68 and by wet etching using ammonium fluoride. When removing the second insulating film 68, the region of the first nitride semiconductor layer 10 is exposed where the uneven portion 20 is to be formed.

Figure 5D:
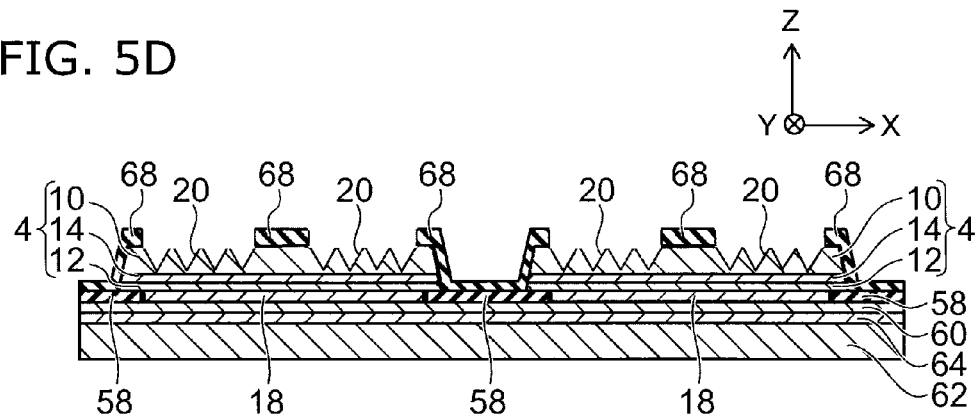

As illustrated in FIG. 5D, the uneven portion 20 is formed in the first nitride semiconductor layer 10 by etching the portion 10*p* of the first nitride semiconductor layer 10 using the second insulating film 68 as a mask. For example, the formation of the uneven portion 20 is performed by etching using potassium hydroxide. For example, the etching is performed using potassium hydroxide at a temperature of 70° C.

and a concentration of 1 mol/l for 15 minutes. Thereby, the surface of the first nitride semiconductor layer 10 is surface-roughened. For example, the uneven portion 20 is formed in the first nitride semiconductor layer 10 with a surface roughness of not less than 100 nm and not more than 3000 nm.

Figure 6A:
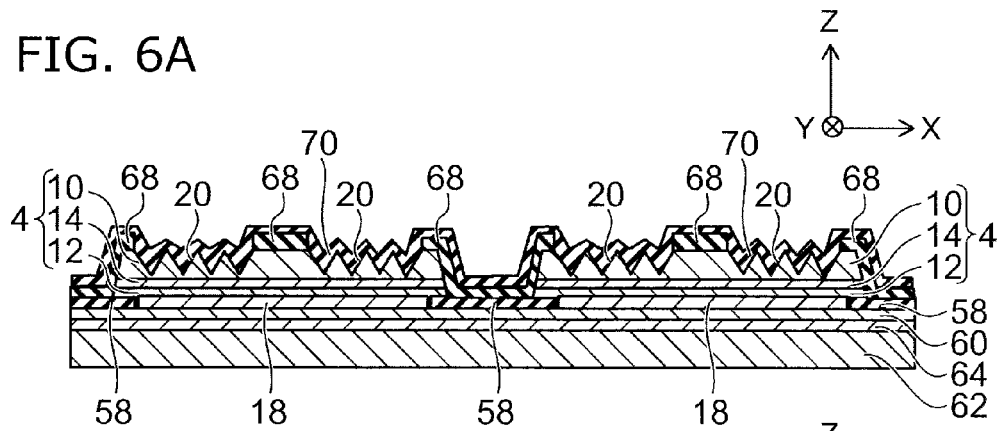
FIG. 6A to FIG. 6D are schematic cross-sectional views illustrating the method for manufacturing the semiconductor light emitting element according to the embodiment.

As illustrated in FIG. 6A, a third insulating film 70 that is used to form the third insulating layer 34 is formed on the first nitride semiconductor layer 10 and the second insulating film 68. The third insulating film 70 may include, for example, $SiO_2$.

Figure 6B:
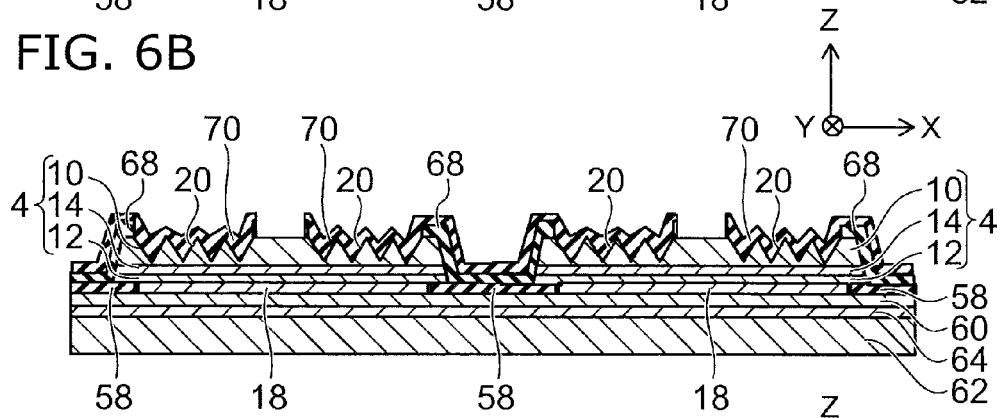

As illustrated in FIG. 6B, a portion of the first nitride semiconductor layer 10 is exposed by removing portions of the second insulating film 68 and the third insulating film 70. For example, lithography and etching are used to remove the second insulating film 68 and the third insulating film 70. The portion of the first nitride semiconductor layer 10 where the uneven portion 20 is not formed, i.e., the portion where the first electrode 16 is to be formed, is exposed when removing the second insulating film 68 and the third insulating film 70.

Figure 6C:
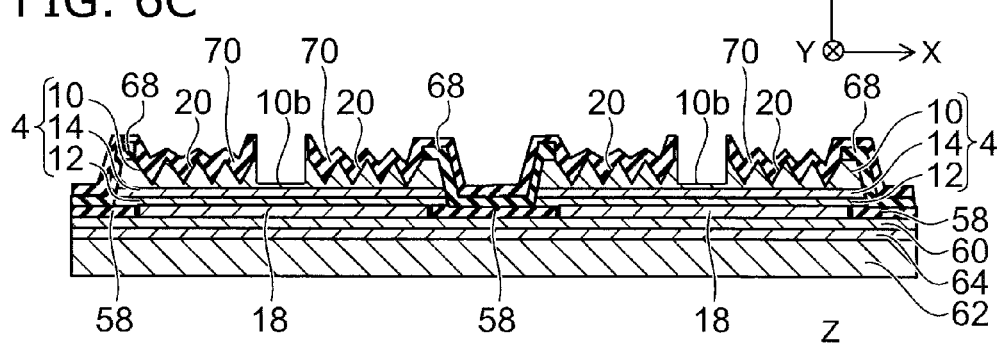

As illustrated in FIG. 6C, the recess 10b for forming the first electrode 16 is made in the first nitride semiconductor layer 10 by etching the first nitride semiconductor layer 10 using the third insulating film 70 as a mask.

Figure 6D:
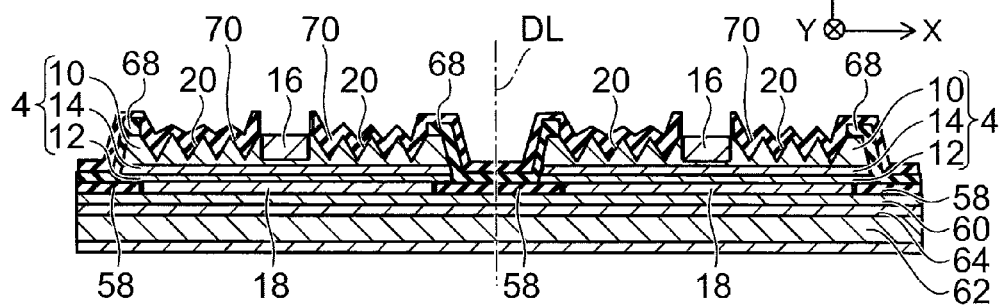

As illustrated in FIG. 6D, the first electrode 16 is formed on the first nitride semiconductor layer 10 inside the recess 10b. For example, the first electrode 16 is formed by forming a metal film including at least one element selected from Ti, Al, Rh, In, Ni, Pt, and Au and by patterning the metal film into a prescribed configuration. Thus, for example, the first electrode 16 includes at least one element selected from the group consisting of Ti, Al, Rh, In, Ni, Pt, and Au.

After forming the first electrode 16, the thickness of the substrate main body 62 is reduced by polishing the fourth surface 62b of the substrate main body 62. By the polishing of the substrate main body 62, the thickness of the substrate main body 62 becomes, for example, not less than 50 μm and not more than 250 μm. Subsequently, the back surface electrode 28 is formed on the fourth surface 62b of the substrate main body 62. For example, the back surface electrode 28 is a metal film including at least one element selected from Ti, Al, Rh, In, Ni, Pt, and Au. Subsequently, the substrate main body 62 is divided into the stacked bodies 4 by performing dicing along a dicing line DL. Thereby, the multiple semiconductor light emitting elements 110 are formed.

Figure 9:
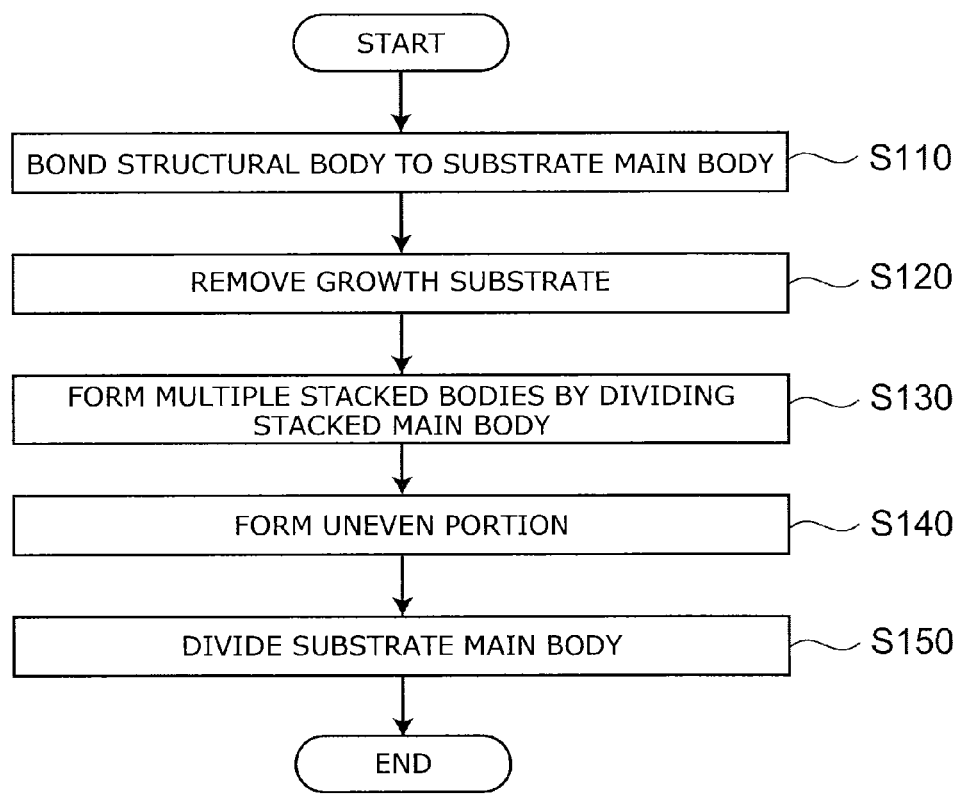
FIG. 9 is a flowchart illustrating the method for manufacturing the semiconductor light emitting element according to the embodiment.

FIG. 9 is a flowchart illustrating the method for manufacturing the semiconductor light emitting element according to the embodiment.

As illustrated in FIG. 9, the method for manufacturing the semiconductor light emitting element according to the embodiment includes step 110 of bonding the structural body 120 to the substrate main body 62, step 120 of removing the growth substrate 50, step 130 of forming the multiple stacked bodies 4 by dividing the stacked main body 52, step 140 of forming the uneven portion 20, and step 150 of forming the multiple semiconductor light emitting elements 110 by dividing the substrate main body 62.

In step S110, for example, the process described in regard to FIG. 4A is implemented. In step S120, for example, the process described in regard to FIG. 4B is implemented. In step S130, for example, the process described in regard to FIG. 5A is implemented. In step S140, for example, the process described in regard to FIG. 5D is implemented. In step S150, for example, the process described in regard to FIG. 6D is implemented.

In the method for manufacturing the semiconductor light emitting element according to this embodiment, the uneven portion 20 is formed in the first nitride semiconductor layer 10 after the stacked bodies 4 are formed by dividing the stacked main body 52.

In such a case, because the stacked main body 52 is divided prior to the wet etching that forms the uneven portion 20, the wet etching is performed in the state in which the side surfaces are formed for the multiple stacked bodies 4 which are formed from the stacked main body 52. Therefore, a protective layer (e.g., a $SiO_2$ layer) is provided on the side surfaces of the stacked bodies 4 to suppress the degradation of the side surface in the wet etching.

On the other hand, it also may be considered to use a method for manufacturing the semiconductor light emitting element in which the uneven portion 20 is formed in the first nitride semiconductor film 53 while in the state of the stacked main body 52 and by subsequently dividing the stacked main body 52. In such a case, it is unnecessary to provide the protective layer recited above. Therefore, the processes are simple. For example, this method is employed in the case where the stacked main body 52 is formed on a sapphire substrate.

Similarly to the method for forming the stacked main body 52 on the sapphire substrate, the inventor of the application constructed semiconductor light emitting elements by forming the stacked main body 52 on a silicon substrate and by forming the uneven portion 20 in the first nitride semiconductor film 53 prior to dividing the stacked main body 52. It was found that cracks occur in such a case.

Figure 10:
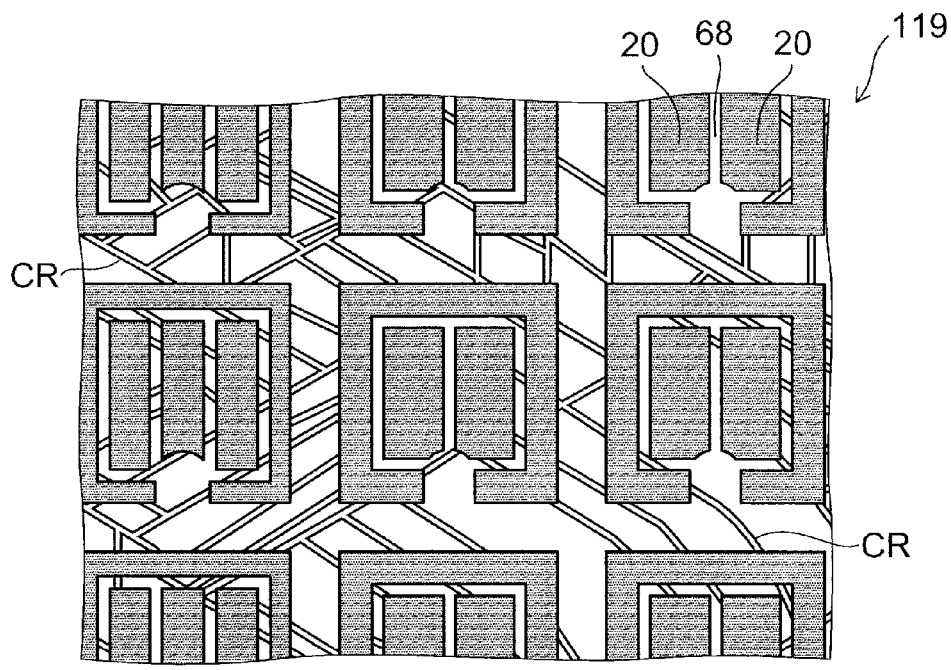
FIG. 10 is an optical microscope image diagram of semiconductor light emitting elements of a reference example.

FIG. 10 is an optical microscope image diagram of semiconductor light emitting elements of a reference example.

FIG. 10 is an optical microscope image diagram of a portion of the semiconductor light emitting elements 119 that are manufactured by a method in which the uneven portion 20 is formed in the state of the stacked main body 52 (prior to the dividing). The stacked main body 52 is formed on a silicon substrate; and tensile stress is applied to the stacked main body 52.

As illustrated in FIG. 10, many cracks CR occur in the semiconductor light emitting elements 119. By detailed analysis of these cracks CR, it was found that the cracks CR occur in directions along the crystal orientation of the semiconductor crystal. By more detailed analysis, it was ascertained that these cracks CR occur with a recess or a protrusion of the uneven portion 20 as a starting point.

Although the process conditions for forming the uneven portion 20, etc., were investigated to reduce the cracks CR, it was difficult to sufficiently reduce the cracks CR.

Then, an experiment was performed in which the order of the dividing process of the stacked main body 52 and the formation process of the uneven portion 20 in the first nitride semiconductor film 53 were interchanged. This order corresponds to the method for manufacturing the semiconductor light emitting element according to this embodiment.

Figure 11:
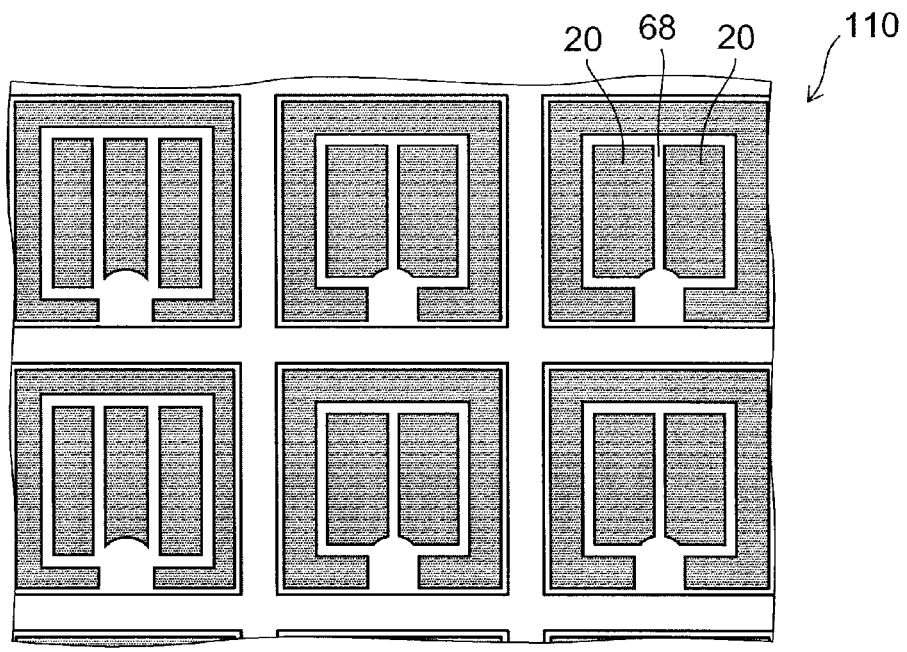
FIG. 11 is an optical microscope image diagram of the semiconductor light emitting elements manufactured by the manufacturing method according to the embodiment.

FIG. 11 is an optical microscope image diagram of the semiconductor light emitting elements manufactured by the manufacturing method according to the embodiment.

As illustrated in FIG. 11, the cracks CR substantially did not occur in the semiconductor light emitting elements 110 constructed by the manufacturing method according to this embodiment. It was found that the occurrence of the cracks CR can be suppressed in the method in which the wet etching to form the uneven portion 20 is implemented after the stacked main body 52 is divided.

In the case where the stacked main body 52 is formed on the sapphire substrate, tensile stress is not applied to the stacked main body 52; and compressive stress is applied. It is considered that the cracks CR do not occur easily in the case where the compressive stress is applied even in the case where the value of the stress is large because the films are in a state of being pressed. Therefore, the cracks CR do not occur even in the case where the uneven portion 20 is formed while in the state of the large surface area prior to dividing the stacked main body 52.

However, tensile stress is applied to the stacked main body 52 in the case where the stacked main body 52 is formed on the silicon substrate. It is considered that the cracks CR occur easily in the case where the stress that is applied is tensile stress, even when the value of the stress is small. Therefore, it is considered that the cracks CR occur extremely easily in the case where the tensile stress is applied to the stacked main body 52 if the uneven portion 20 is formed while in the state of the large surface area (the state of the stacked main body 52 as-is).

The method for manufacturing the semiconductor light emitting element according to this embodiment is derived based on such experimental evidence.

In this embodiment, in the case where the stacked main body 52 to which the tensile stress is applied is used, the uneven portion 20 is formed in the state in which the stress applied to the stacked main body 52 is relaxed by dividing the stacked main body 52 into small surface areas prior to forming the uneven portion 20. By forming the uneven portion 20 in the state in which the tensile stress that is applied is relaxed, the occurrence of the cracks CR can be drastically reduced.

Conversely, it is considered that the cracks CR occur in the stacked main body 52 of the semiconductor light emitting elements 119 illustrated in FIG. 10 because the formation of the uneven portion 20 is performed while in the state of the stacked main body 52 having the large tensile stress applied.

In the method for manufacturing the semiconductor light emitting element according to this embodiment, the uneven portion 20 is formed in the state in which the tensile stress is reduced by performing the dividing of the stacked main body 52 (the formation of the stacked bodies 4) first. Thereby, the occurrence of the cracks CR can be suppressed; and the yield can be increased.

In the case where the uneven portion 20 is formed in the state of the stacked main body 52, the cracks may undesirably affect portions of adjacent elements because a crack that occurs in one of the uneven portions 20 occurs in the state in which the multiple elements are continuous. Conversely, in the method for manufacturing the semiconductor light emitting element according to this embodiment, a crack occurring in one of the uneven portions 20 stops in the portion of the element and does not affect the adjacent elements because the division into the stacked bodies 4 of the elements has been performed.

As recited above, it is unnecessary to employ the order of the processes according to this embodiment in the case of the configuration in which the stacked main body 52 is formed on the sapphire substrate. This order is not employed because the configuration in which the side surfaces of the stacked bodies 4 are protected is necessary in the case where the order of the processes according to this embodiment is employed. In this embodiment, the special order that is employed corresponds to the tensile stress that occurs in the case where the stacked main body 52 is formed on the silicon substrate.

According to the method for manufacturing the semiconductor light emitting element according to this embodiment, the occurrence of the cracks CR can be suppressed; and the yield can be increased drastically.

Although a Si substrate is used as the growth substrate 50 in the embodiment recited above, the growth substrate 50 is not limited thereto. The manufacturing method according to this embodiment is applicable to any configuration in which tensile stress is applied to the stacked main body 52.

According to the embodiments, a method for manufacturing a semiconductor light emitting element having a high yield is provided.

Hereinabove, exemplary embodiments of the invention are described with reference to specific examples.

However, the embodiments of the invention are not limited to these specific examples.

For example, one skilled in the art may similarly practice the invention by appropriately selecting specific configurations of components included in semiconductor light emitting elements such as growth substrates, stacked main bodies, first nitride semiconductor films, light emitting films, second nitride semiconductor films, structural bodies, substrate main bodies, first nitride semiconductor layers, second nitride semiconductor layers, light emitting layers, stacked bodies, uneven portions, supporting substrates, buffer layers, etching stop films, electrodes, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all methods for manufacturing semiconductor light emitting element practicable by an appropriate design modification by one skilled in the art based on the methods for manufacturing semiconductor light emitting element described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting element, comprising:
    bonding a stacked main body to a substrate main body, the stacked main body being included in a structural body, the structural body further including a growth substrate, the stacked main body being provided on the growth substrate, the stacked main body including a first nitride semiconductor film of a first conductivity type, a light emitting film provided on the first nitride semiconductor film, and a second nitride semiconductor film of a second conductivity type provided on the light emitting film, tensile stress being applied to the stacked main body;
    removing the growth substrate;
    forming a plurality of stacked bodies by dividing the stacked main body into a plurality of regions by removing a portion of the stacked main body, the stacked bodies including a first nitride semiconductor layer formed from the first nitride semiconductor film, a second nitride semiconductor layer formed from the second nitride semiconductor film, and a light emitting layer formed from the light emitting film;

forming an uneven portion in a surface of the first nitride semiconductor layer on a side opposite to the light emitting layer for each of the stacked bodies; and forming a plurality of the semiconductor light emitting elements by dividing the substrate main body for each of the stacked bodies, each of the semiconductor light emitting elements including the stacked body and a supporting substrate formed from the divided substrate main body, wherein the removing of the growth substrate includes polishing the growth substrate to cause a thickness of the growth substrate to be not less than 5 µm and not more than 50 µm.

2. The method according to claim 1, further comprising forming the structural body by:

forming the first nitride semiconductor film on the growth substrate;

forming the light emitting film on the first nitride semiconductor film; and forming the second nitride semiconductor film on the light emitting film.

3. The method according to claim 2, wherein:

the forming of the structural body further includes forming a buffer layer between the growth substrate and the first nitride semiconductor film, the buffer layer being used as a stopper when removing the growth substrate; and the removing of the growth substrate further includes removing the buffer layer.

4. A method for manufacturing a semiconductor light emitting element, comprising:

forming a structural body, the structural body including a growth substrate and a stacked main body, the stacked main body being provided on the growth substrate, the stacked main body including a first nitride semiconductor film of a first conductivity type, a light emitting film provided on the first nitride semiconductor film, and a second nitride semiconductor film of a second conductivity type provided on the light emitting film, tensile stress being applied to the stacked main body;

bonding the stacked main body to a substrate main body;

removing the growth substrate;

forming a plurality of stacked bodies by dividing the stacked main body into a plurality of regions by removing a portion of the stacked main body, the stacked bodies including a first nitride semiconductor layer formed from the first nitride semiconductor film, a second nitride semiconductor layer formed from the second nitride semiconductor film, and a light emitting layer formed from the light emitting film;

forming an uneven portion in a surface of the first nitride semiconductor layer on a side opposite to the light emitting layer for each of the stacked bodies; and forming a plurality of the semiconductor light emitting elements by dividing the substrate main body for each of the stacked bodies, each of the semiconductor light emitting elements including the stacked body and a supporting substrate formed from the divided substrate main body, the forming of the structural body including:

forming the first nitride semiconductor film on the growth substrate;

forming the light emitting film on the first nitride semiconductor film; and forming the second nitride semiconductor film on the light emitting film, the forming of the structural body further including forming a buffer layer between the growth substrate and the first nitride semiconductor film, the buffer layer being used as a stopper when removing the growth substrate, the removing of the growth substrate further including removing the buffer layer, the forming of the first nitride semiconductor film further including forming a first layer on the buffer layer and forming a second layer on the first layer, a concentration of an impurity of the second layer being higher than a concentration of an impurity of the first layer, and the removing of the growth substrate further including removing the first layer.

5. The method according to claim 1, wherein the growth substrate is a Si substrate.

6. The method according to claim 1, further comprising forming a first electrode on the surface of the first nitride semiconductor layer on the side opposite to the light emitting layer, the first electrode being electrically connected to the first nitride semiconductor layer.

7. The method according to claim 6, wherein the forming of the first electrode includes making a recess in the surface of the first nitride semiconductor layer on the side opposite to the light emitting layer and forming the first electrode inside the recess.

8. The method according to claim 1, further comprising forming an etching stop film on the second nitride semiconductor film prior to the bonding of the major surface of the structural body to the substrate main body, the forming of the stacked bodies by dividing the stacked main body including dividing the stacked main body by etching the stacked main body from the first nitride semiconductor film side to the etching stop film.

9. A method for manufacturing a semiconductor light emitting element, comprising:

bonding a stacked main body to a substrate main body, the stacked main body being included in a structural body, the structural body further including a growth substrate, the stacked main body being provided on the growth substrate, the stacked main body including a first nitride semiconductor film of a first conductivity type, a light emitting film provided on the first nitride semiconductor film, and a second nitride semiconductor film of a second conductivity type provided on the light emitting film, tensile stress being applied to the stacked main body;

removing the growth substrate;

forming a plurality of stacked bodies by dividing the stacked main body into a plurality of regions by removing a portion of the stacked main body, the stacked bodies including a first nitride semiconductor layer formed from the first nitride semiconductor film, a second nitride semiconductor layer formed from the second nitride semiconductor film, and a light emitting layer formed from the light emitting film;

forming an uneven portion in a surface of the first nitride semiconductor layer on a side opposite to the light emitting layer for each of the stacked bodies; and forming a plurality of the semiconductor light emitting elements by dividing the substrate main body for each of the stacked bodies, each of the semiconductor light emitting elements including the stacked body and a supporting substrate formed from the divided substrate main body, the bonding the stacked main body to the substrate main body including:
　forming an etching stop film on the second nitride semiconductor film prior to the bonding of the major surface of the structural body to the substrate main body;
　exposing a portion of the second nitride semiconductor film by removing a portion of the etching stop film prior to the bonding of the major surface of the structural body to the substrate main body; and
　forming an electrode on the portion of the second nitride semiconductor film, the electrode being electrically connected to the second nitride semiconductor film,
　the forming of the stacked bodies by dividing the stacked main body including dividing the stacked main body by etching the stacked main body from the first nitride semiconductor film side to the etching stop film.

10. The method according to claim 9, wherein a thickness of the electrode along a stacking direction of the stacked main body is the same as a thickness of the etching stop film along the stacking direction.

11. The method according to claim 8, wherein the etching stop film is an oxide film of at least one selected from Si, Al, Ti, Zr, In, Sn, and Ni, a nitride film of the at least one, or an oxynitride film of the at least one.

12. The method according to claim 8, wherein the etching stop film is a metal including at least one element selected from the group consisting of Ni, Pt, W, Au, Ti, and Al.

13. The method according to claim 8, wherein the etching of the stacked main body is dry etching including one element selected from chlorine, argon, fluorine, and boron.

14. The method according to claim 1, wherein the bonding of the structural body to the substrate main body includes forming a first bonding film on the stacked main body, forming a second bonding film on the substrate main body, and bonding the first bonding film to the second bonding film.

15. The method according to claim 1, wherein the forming of the uneven portion includes forming an insulating film on the first nitride semiconductor layer, exposing a portion of the first nitride semiconductor layer by removing a portion of the insulating film, and etching the portion of the first nitride semiconductor layer using the insulating film as a mask.

16. The method according to claim 15, wherein the insulating film covers a side surface of the stacked bodies.

17. The method according to claim 1, wherein a surface roughness of the uneven portion is not less than 100 nm and not more than 3000 nm.

18. The method according to claim 1, further comprising forming a back surface electrode on a back surface of the substrate main body,
　the back surface being a surface of the substrate main body on a side opposite to a bonding surface of the substrate main body, the bonding surface being bonded to the stacked main body.

19. A method for manufacturing a semiconductor light emitting element, comprising:
　bonding a stacked main body to a substrate main body, the stacked main body being included in a structural body, the structural body further including a growth substrate, the stacked main body being provided on the growth substrate, the stacked main body including a first nitride semiconductor film of a first conductivity type, a light emitting film provided on the first nitride semiconductor film, and a second nitride semiconductor film of a second conductivity type provided on the light emitting film, tensile stress being applied to the stacked main body;
　removing the growth substrate;
　forming a plurality of stacked bodies by dividing the stacked main body into a plurality of regions by removing a portion of the stacked main body, the stacked bodies including a first nitride semiconductor layer formed from the first nitride semiconductor film, a second nitride semiconductor layer formed from the second nitride semiconductor film, and a light emitting layer formed from the light emitting film;
　forming an uneven portion in a surface of the first nitride semiconductor layer on a side opposite to the light emitting layer for each of the stacked bodies;
　forming a back surface electrode on a back surface of the substrate main body, the back surface being a surface of the substrate main body on a side opposite to a bonding surface of the substrate main body the bonding surface being bonded to the stacked main body; and
　forming a plurality of the semiconductor light emitting elements by dividing the substrate main body for each of the stacked bodies, each of the semiconductor light emitting elements including the stacked body and a supporting substrate formed from the divided substrate main body,
　the forming of the back surface electrode further including polishing the substrate main body to cause a thickness of the substrate main body to be not less than 50 μm and not more than 250 μm.

* * * * *